United States Patent
Becker et al.

(10) Patent No.: US 6,531,031 B1
(45) Date of Patent: Mar. 11, 2003

(54) PLASMA ETCHING INSTALLATION

(75) Inventors: Volker Becker, Marxzell (DE); Franz Laermer, Stuttgart (DE); Andrea Schilp, Schwabisch Gmund (DE); Thomas Beck, Kirchber/Murr (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/623,734

(22) PCT Filed: Dec. 31, 1999

(86) PCT No.: PCT/EP99/04130
§ 371 (c)(1),
(2), (4) Date: Nov. 22, 2000

(87) PCT Pub. No.: WO00/41210
PCT Pub. Date: Jul. 13, 2000

(30) Foreign Application Priority Data

Jan. 7, 1999 (DE) .......................................... 199 00 179

(51) Int. Cl.[7] .............................................. H01L 21/00
(52) U.S. Cl. .............................. 156/345.48; 118/723 I; 118/723 AN
(58) Field of Search ....................... 118/723; 156/345.48

(56) References Cited

U.S. PATENT DOCUMENTS

| | | | |
|---|---|---|---|
| 5,147,493 A | * | 9/1992 | Nishimura et al. |
| 5,332,880 A | | 7/1994 | Noboru et al. .......... 219/121.52 |
| 5,429,070 A | * | 7/1995 | Campbell et al. ....... 118/723 R |
| 5,565,074 A | * | 10/1996 | Qian et al. .............. 204/298.08 |
| 5,573,595 A | | 11/1996 | Dible ................... 118/723 MP |
| 5,637,961 A | | 6/1997 | Kibatsu et al. .......... 315/111.51 |
| 5,683,539 A | * | 11/1997 | Qian et al. .................... 156/345 |
| 5,824,606 A | * | 10/1998 | Dible et al. .................. 438/729 |
| 5,866,986 A | * | 2/1999 | Pennington ............ 315/111.21 |
| 5,965,034 A | * | 10/1999 | Vinogradov et al. .......... 216/68 |
| 6,013,155 A | * | 1/2000 | McMillin et al. ............ 156/345 |
| 6,139,679 A | * | 10/2000 | Satipunwaycha ............ 156/345 |
| 6,164,241 A | * | 12/2000 | Chen et al. ............... 118/723 I |
| 6,305,316 B1 | * | 10/2001 | DiVergilio et al. ........ 118/723 I |

FOREIGN PATENT DOCUMENTS

EP WO99/01887 A 1/1999

* cited by examiner

Primary Examiner—Gregory Mills
Assistant Examiner—Michelle Crowell
(74) Attorney, Agent, or Firm—Kenyon & Kenyon

(57) ABSTRACT

A plasma processing system for etching a substrate using a highly dense plasma in a reactor. An ICP coil having a first coil end and a second coil end generating a high-frequency electromagnetic alternating field in the reactor which acts on a reactive gas and, as an inductively coupled plasma source, produces the highly dense plasma from reactive particles and ions. The two coil ends each communicate via a feed point with a high-frequency infeed, which applies in each case a high-frequency a.c. voltage of the same frequency to the first coil end and to the second coil end (21, 21'). The two high-frequency a.c. voltages applied at the two coil ends are connected to a symmetrical, capacitive network via a $\lambda/2$-delay line linking the first feed point and the second feed point and are, at least nearly in phase opposition to one another, and have at least nearly the same amplitudes.

19 Claims, 3 Drawing Sheets

PLASMA ETCHING INSTALLATION

FIELD OF THE INVENTION

The present invention relates to a plasma processing system

BACKGROUND INFORMATION

Plasma processing systems of this kind, which use inductively coupled plasma sources, are suited, in particular, for deeply etching silicon at very high etching rates, employing the method described in German Patent DE 42 41 045, and are widely known. A simple and proven arrangement is made up of an ICP coil (ICP="inductively coupled plasma"), which is wound around a plasma volume and is fed by a high-frequency a.c. voltage. In the plasma volume, the high-frequency currents flowing through the ICP coil induce a high-frequency, magnetic alternating field, whose electric curl (rotational or vortex) field, in turn, excites the plasma in accordance with the law of induction (rotE=−∂B/∂t). The applied high frequency has values of between 600 kHz and 27 MHz; a frequency of 13.56 MHz is usually used.

In the method known from German Patent DE 42 41 045, a plasma source, preferably having inductive high-frequency excitation, is used to liberate fluorine radicals from a fluorine-supplying etching gas, and passivation gas $(CF_2)_x$ from a Teflon-forming monomer, the plasma source generating a highly dense plasma having a relatively high density of ions ($10^{10}$–$10^{12}$ cm$^{-3}$) of a low energy, and the etching and passivation gases being alternately used. The ionic energy, which accelerates the generated ions toward the substrate surface, is likewise relatively low, i.e., between 1–50 eV, preferably 5–30 eV. In the description, FIG. 2 of this patent shows a typical asymmetrical supplying of an ICP coil of such a plasma source, as known from the related art. In the simplest case, it is composed of only one single winding around a reactor in the form of a vessel (tank or chamber) made of ceramic material, having a diameter of, for example, 40 cm. One coil end is grounded; the other coil end is fed with the high-frequency a.c. voltage, and described as "hot", because at this coil end, very high voltages of, for example, 1000–3000 volts build up, which are typical for the amplitude of the supplied high-frequency high voltage.

The capacitors $C_2$ and $C_3$, likewise shown in FIG. 2, are used to adapt the impedance of an asymmetrical 50 Ω coaxial cable output of a high-frequency incoming supply to the impedance of the asymmetrically operated ICP coil (so-called "matchbox" or "matching capacitors"). The capacitor $C_4$ is connected in parallel to the ICP coil and, together with the matching capacitors, produces the resonance condition.

The consequence of supplying the plasma source in the known asymmetrical and inductive fashion is that the asymmetry is also projected onto the plasma that is produced. On the average, depending on the intensity of an occurring capacitive coupling, this lies above earth potential by a few up to tens of volts. Thus, one coil end of the ICP coil is at earth potential (0 V) and the opposite "hot" coil end is at a high high-frequency voltage of up to a few thousand volts. As a result, strong electrical fields are induced in the plasma, in particular at the "hot" coil end, through the ceramic vessel wall of the reactor, which, in turn, produce displacement currents in the plasma, through the ceramic vessel wall. In this case, one speaks of the already mentioned "capacitive coupling", while the actual production of plasma is an inductive mechanism, i.e., one based on time-variable magnetic fields.

For the most part, the capacitive coupling causes a current to flow from the supplied, i.e., "hot" coil end, through the ceramic vessel wall of the reactor, into the plasma. Since the average plasma potential fluctuates near earth potential, to which the "cold" coil end is also fixed, and since the potential difference between the plasma and the "cold" coil end is too small to allow the displacement current to flow off (discharge) again across the ceramic vessel wall to the coil, this current flow is not able to flow off (discharge) to the grounded coil end. Thus, the displacement current must discharge (flow off) from the region of the "hot" coil end into the plasma, again out of the plasma, across a ground that is in direct contact with the plasma. In known methods heretofore, this is essentially the substrate electrode, which, for example, as a substrate, bears a wafer, and which is operated via a separate high-frequency supplying at a low negative DC bias potential of 1–50 V with respect to the plasma. Therefore, it is able to directly take up the mentioned displacement currents. However, this leads to inhomogeneities in the plasma-processing method in question, across the substrate surface and, thus, partially to considerable profile deviations when etching in individual regions.

In addition, the strong electrical fields occurring on one side, due to the asymmetrical supplying, distort the position and density distribution of the produced plasma, which is shifted away from the middle of the reactor and is displaced, for example, toward the "hot" coil end. In this case, one speaks of a so-called "bull's eye shift", since the inhomogeneity of the plasma is projected in the shape of an eye onto the wafer used as a substrate, and since this "eye" shifts away from the middle of the wafer toward the wafer rim.

A first measure for improving the process homogeneity and for avoiding the "bull's eye shift" is a process known from German Patent DE 42 41 045, as described in the unpublished Application DE 197 34 278.7. An aperture construction is proposed, which, due to an expanded ionic recombination zone at the inner wall of a metal cylinder mounted on an aperture, homogenizes the ionic flow toward the substrate across the substrate surface in question. It does this by incorporating an ionic loss mechanism in the outer region of the plasma attaining the substrate. It also recenters the plasma and partially shields electrical fields coming from the source region of the plasma, on the way to the substrate.

A further measure, which diminishes profile deviations of etched structures on the substrate or a wafer, occurring, in part, as the result of electrical interference fields, is proposed in the unpublished Application DE 197 363 70.9, in which a so-called "parameter ramping" is used.

In the same way as the "hot" coil end, i.e., the "cold" coil end, the grounded coil end in the related art, is a problem zone, because this end is the location of minimal feeding in (injection) or feeding out (coupling out) of displacement current, due to the capacitive coupling into the produced plasma. Moreover, in known methods heretofore, the corresponding "cold" voltage feed point of the ICP coil, which is in communication with the "cold" coil end, must be grounded with great care, since, in the active ambient environment of the plasma reactor, vertically flowing currents, in particular, must be avoided at all costs, i.e., currents flowing from the ICP coil down to the grounded housing. Such vertical currents, in other words currents that do not flow in parallel to the coil plane defined by the ICP coil, result in a time-variable magnetic field that is tilted by 90° and that has corresponding electrical induction effects over the electric curl (rotational or vortex) field. This leads to considerable local disturbances in the plasma, which are manifested, in turn, in profile deviations (pocket formations, negative etching-edge slopes, mask rim undercuts).

Another interference effect that is known in related-art methods and is caused by high voltages at a "hot" coil end, entails sputtering deposition at this end, on the inside of the reactor side wall, by ion bombardment, i.e., by positively charged ions accelerated by strong electrical fields toward the chamber wall. In the process, sputtered wall material can also attain the wafer or the substrate and have a micro-masking effect there. The consequence, as is generally known, is the formation of silicon needles, micro-roughness, or silicon particles. Since the sputter-type ablation of the reactor side wall scales the applied high-frequency voltage, to achieve minimal sputter rates, it is desirable that the high-frequency voltage applied to the ICP coil be kept to a minimum toward the plasma.

One approach, already known from the related art, proposes using a transformer to symmetrically feed the ICP coil. The transformer is supplied on the primary side with a high-frequency a.c. voltage via a high-frequency feed-in, and has a secondary coil with a grounded, middle tapping point. This enables the transformer to supply both ends of the ICP coil of a plasma-processing system with a high-frequency, 180° out-of-phase high voltage of at least nearly the same amplitude. A transformer of this kind is usually constructed using a coil winding of litz wire on a ferritic core material, a cup-type or toroidal core being used as the ferritic core. A serious drawback that transformers of this kind have, however, is that high magnetic losses, ranging from 10–20%, occur in the core materials at frequencies of, for example, 13.56 MHz. This leads to considerable thermal problems in the case of high high-frequency power of usually between 500 to 3000 watts, in ICP plasma-processing systems. Moreover, phase errors also occur due to the frequency-dependent energy absorption through the core material in the transformer. At the symmetrical output, these phase errors, in part, substantially distort the 180° phase of the two high voltages that need to be injected in phase opposition. In addition, transformers of this kind have the undesirable effect of limiting the amount of high-frequency power that can be injected into the plasma.

SUMMARY OF THE INVENTION

The plasma processing system in accordance with the present invention having the characteristic features of the main claim has the advantage over the related art that both coil ends are supplied via a symmetrical coil in-feed with a high-frequency voltage of the same frequency, the ICP coil being symmetrically supplied with two high-frequency a.c. voltages, in phase opposition to one another, at a first coil end and a second coil end by a $\lambda/2$ delay line (slow-wave structure) (a so-called cable balun (balanced to unbalanced transformer)) provided between and connecting a first voltage feed point and a second voltage feed point. Independently of voltage and power, the $\lambda/2$ delay line effects a 180° phase shift of the voltage U(t) supplied at a first voltage feed point and, thus, an in-feed of −U(t) at a second voltage feed point. Thus, without entailing substantial technical outlay or additional cost-intensive components, two high-frequency, 180° out-of-phase a.c. voltages having the same frequency and at least nearly the same amplitude are produced from one voltage made available by the high-frequency supplying. This renders possible especially simple, low-loss plasma processing or plasma etching methods that are suitable for high high-frequency power (several kilowatts), for inductive plasma sources, in particular.

In addition, in the case of the symmetrical supplying of the ICP coil in accordance with the present invention, both coil ends become "hot", in other words both coil ends now conduct a high-frequency a.c. voltage of considerable, in the ideal case, of identical amplitude, which occurs at both coil ends in exact phase opposition. Thus, if a voltage $\hat{U}(t)$ is applied at the first coil end, then a voltage $-\hat{U}(t)$, whose amplitude is only still half as great as the asymmetrical supplying in the related art, is applied accordingly to the second coil end, because the original a.c. voltage $2*\hat{U}(t)$ to ground is now divided into $\hat{U}(t)$ and $-\hat{U}(t)$ to ground. By halving the voltage amplitude at the two coil ends in this manner, disturbing wall sputter rates at the inner reactor wall are initially drastically reduced.

The concentration of undesirable high-energy ions is also reduced very advantageously. These high-energy ions are otherwise accelerated by high electrical fields toward the reactor wall, are reflected there, and, consequently, returned to the produced plasma. There, they affect the processed substrate in numerous disturbing ways, such as by causing profile disturbances, or damage to the oxide layers on an etched wafer. At the same time, the concentration of high-energy electrons in the produced plasma also decreases, since the capacitive current injection into the produced plasma is substantially reduced by the symmetrical coil feeding (at least by a factor of 2), so that the electron gas is no longer heated in a relevant manner. The beneficial result is that the produced plasma becomes colder. Besides this, high-energy electrons are generally undesirable for the plasma processes, because they absorb high-frequency power unnecessarily.

Since the electrical stray fields from the coil region are inversely the same in the case of symmetrical coil feeding, they also even out very advantageously, so that the so-called "bull's eye shift" no longer occurs.

In addition, the currents, which are capacitively injected into the produced plasma and which, as mentioned, are already perceptibly smaller, are now likewise inversely the same, i.e., they even out (become equalized) between the coil ends and, very advantageously, no longer flow via grounding systems, such as the substrate electrode and the processed substrate, that are in direct contact with the plasma.

Since in the plasma-processing system of the present invention, at every instant, each of the two coil ends of the ICP coil receives the negative voltage value of the other associated coil end, the displacement current induced in the produced plasma by one coil end, via the ceramic reactor wall as a dielectric, can likewise be taken up by the other coil end, likewise via the ceramic reactor wall as a dielectric, so that there is no need for a charge compensation via a potential to ground, i.e., via the substrate surface. This substantially improves etching-rate and profile homogeneity across the substrate surface, and fewer profile deviations occur.

In addition, the plasma potential advantageously approaches is the ground potential, since electrical injections into the plasma clearly diminish, and the remaining injections are equalized because of their symmetry. In addition, the plasma symmetry also increases advantageously, since by removing the capacitive injection distorting the plasma or by equalizing the injection, one obtains a colder and, in the ideal case, a rotationally symmetric plasma, without any obvious potential differences at individual points in the plasma (plasma locations).

Advantageous embodiments of the present invention are derived from the measures delineated in the dependent claims.

Thus, it is also advantageous, even given a symmetrical supplying of the ICP coil, for all current-carrying conductors in an active ambient environment of the reactor or the ICP coil, to be run in parallel to the coil plane defined by the ICP coil. Ambient environment is understood, in this context, to be a region around the reactor and the ICP coil, in which relevant disturbing influences are caused by electromagnetic interactions between the currents flowing in the conductors and the produced plasma. Thus, the only currents flowing in the vicinity of the produced plasma, are concentrated, parallel-conducted currents, which do not induce any harmful magnetic interference fields in the plasma. As a result, the plasma has fewer disturbances and is colder, and the risk of the substrate being damaged by high-energy ions or electrons is considerably reduced. At the same time, the plasma potential is also decreased and approaches the ground potential.

By combining the $\lambda/2$ delay line with a preferably symmetrical capacitive network installed between the two voltage feed points and the two coil ends in order to adapt impedance to the produced inductive plasma, one can advantageously achieve a symmetrical supplying of the ICP coil that is virtually loss-less. In combination with a reduction in the supply voltage amplitudes at the two coil ends, the symmetrical feeding of the ICP coil in accordance with the present invention thus permits very high feed-in power into the produced plasma, as an inductive plasma source, reaching into the range of several kilowatts, as well as a scaling-up of the performance parameters of the plasma-processing system, thereby ultimately leading to higher etching rates.

Since in the case of the symmetrical coil feeding in accordance with the present invention, both coil ends are "hot", even if at a lower level (lesser extent), it continues to be very beneficial to configure both "hot" coil ends at an increased distance from the ceramic vessel, which surrounds the produced highly dense plasma in the form of a reactor. This is achieved most simply in that the ICP coil producing the plasma, which at least substantially surrounds the reactor vessel on the outside on a region by region basis, has a somewhat greater diameter than the outer reactor diameter and, thus, is placed around the reactor in such a way that the side of the ICP coil opposing the two coil ends just touches the ceramic of the reactor vessel. The reactor vessel circumference is thus tangent to the larger coil circumference surrounding it at the coil side disposed diametrically opposite from the coil ends. In this manner, the distance of the ICP coil to the plasma produced inside the reactor increases with rising electric potential, the two coil ends, as the locations of the highest electrical potential, having the maximum distance to the reactor. For this, approx. 1–2 cm already suffice. Here as well, it is quite significant that all current-carrying conductors in the ambient environment of the reactor run horizontally in the coil plane defined by the ICP coil, to keep disturbing high-frequency magnetic fields away from the plasma.

In addition, the symmetrical coil feeding can be advantageously combined with the aperture construction proposed in the unpublished Application DE 197 34 278.7. This further reduces the high-frequency magnetic field of the ICP coil at the location of the substrate and homogenizes the plasma density distribution.

In addition or alternatively to the mentioned aperture construction, in the plasma processing system according to the present invention, it is advantageously possible to place a circular, metallic spacer in the reactor side wall, between the plasma source and the substrate electrode, to reduce the influence of high-frequency magnetic fields from the region of the produced, highly dense plasma or the ICP coil, on the substrate, or, for example, on a silicon wafer arranged there.

For this, the spacer preferably has a height of about 10 cm–30 cm and is preferably made of aluminum or of another metal that is resistant to the plasma process. Its use increases the distance between the plasma source, i.e., the location for producing the highly dense plasma through inductive coupling, and the substrate electrode which bears the substrate, and consequently lessens the influence of magnetic and electrical fields, which decrease as a function of the distance r, such as at least by 1/r.

Since the components of the plasma processing system in accordance with the present invention are not subject to any theoretical performance limitations, the system can thus be driven at very high source power in the kilowatt range in a virtually loss-less manner. Due to the lack of energy-absorbing components, the required phase relations between the coil connections are fully retained, independently of the supplied power, and no special measures are required for cooling components. Thus, the present invention provides an excellent reproducibility and reliability of operation for the plasma processing system. In particular, by halving the high-voltage amplitude at both coil ends, even more free space is created for even greater plasma capacity, in that the performance parameters are scaled up, so that very high etching rates are attained for the silicon.

At the same time, a multiplicity of disturbing effects is clearly diminished by the plasma-processing system according to the present invention. These include: wall sputtering, micro-masking caused by sputtered particles, the production of high-energy ions or of very hot electrons in the plasma, an undesirable energy dissipation, a capacitive injection of displacement currents, a distortion of the plasma caused by electrical fields, a shifting of the plasma distribution, an increase in and distortion of the plasma potential, inhomogeneities within the produced plasma, and equalizing currents, which flow across the substrate and substrate electrode to ground.

DETAILED DESCRIPTION

Figure 1:
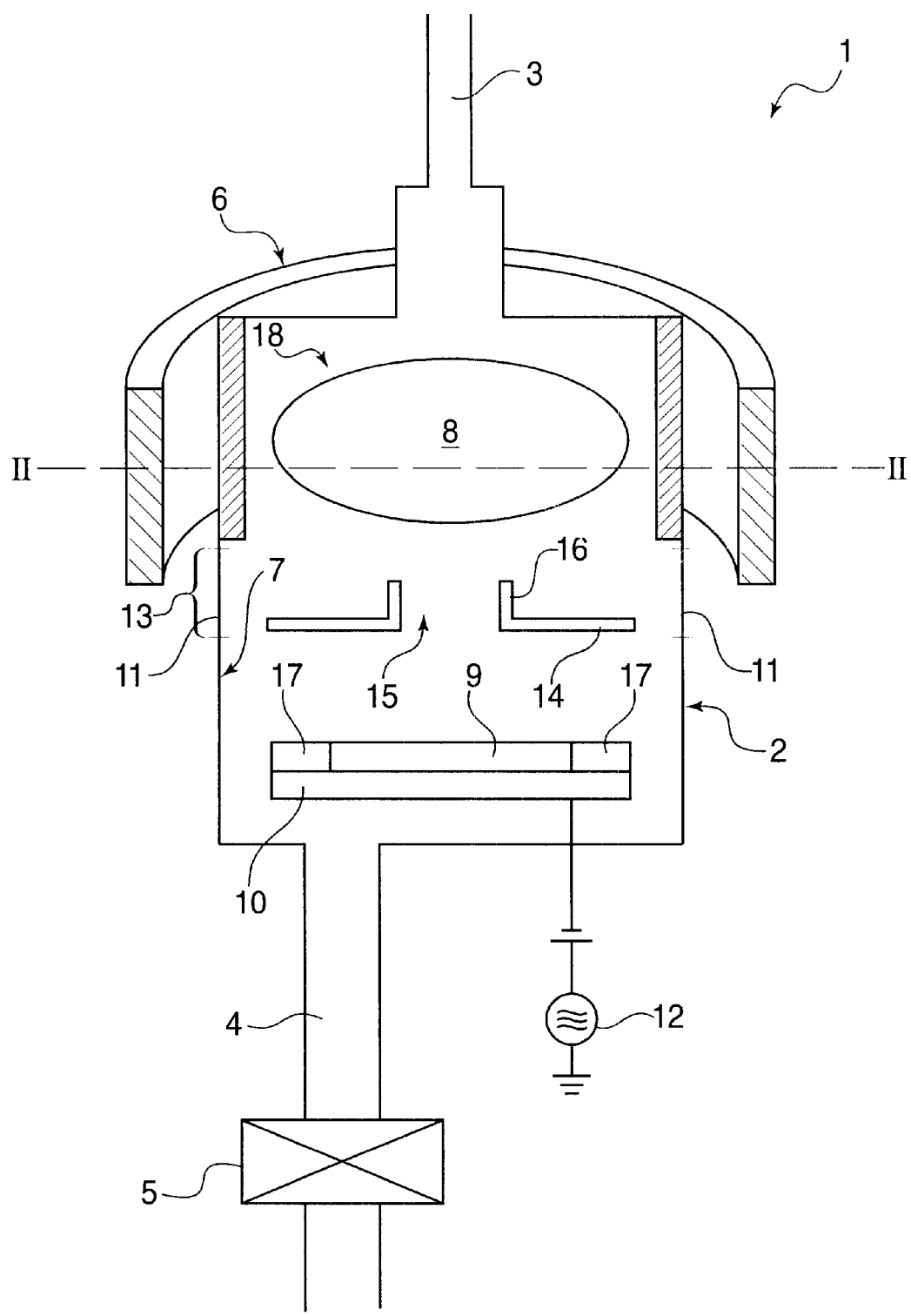
FIG. 1 depicts a block diagram of a plasma-processing system in cross-section.

FIG. 1 illustrates a plasma-processing system 1, already known for the most part from the Application DE 197 34 278.7 in a block diagram, including a reactor 2, a supply connection (feed pipe 3), for example for supplying reactive or etching gases, an exhausting connection 4 having a regulating valve 5 for adjusting a desired process pressure in reactor 2, an ICP coil 6, which is designed as a coil having a winding, and which at least substantially surrounds the top section of reactor 2 in some areas. In the area of ICP coil 6, reactor 2 is made, for the most part, of a ceramic material in the form of a ceramic vessel having a typical diameter of 40 cm and a height of 20 cm, and has a reactor side wall 7, into which a metallic spacer 11, in the form of a circumferential ring is inserted, below the ceramic vessel. Spacer 11 has a height of about 10 cm to 30 cm and is made, in particular, of aluminum. Inside reactor 2, in the top part, an inductively coupled, highly dense plasma 8 is produced by ICP coil 6, in a generally known manner, in that a high-frequency, electromagnetic alternating field is generated in reactor 2 via ICP coil 6, the alternating field acting on a reactive gas and producing, as inductively coupled plasma source 18, highly dense plasma 8 from reactive particles and ions in reactor 2.

Disposed in the lower region of reactor 2 is a substrate 9, which is, for example, a silicon wafer to be processed by plasma etching using an appropriate masking. Substrate 9 is arranged on a substrate electrode 10 and is laterally surrounded by generally known absorbers 17, which thermally couple in efficient fashion into the substrate electrode and consume impinging, excess, reactive particles from the plasma 8. Silicon or graphite are suited, for example, as absorber material for fluorine particles. However, in one alternative specific embodiment, absorber 17 can be omitted or replaced by a quartz or ceramic covering. In addition, in a generally known manner, substrate electrode 10 is connected to a high-frequency voltage source 12. To homogenize the plasma density distribution and the ionic current density, an aperture 13, which has an aperture plate 14 and is fabricated, for example, from 15 mm thick aluminum, is placed between highly dense plasma 8 and substrate 9. The diameter of orifice 15 of aperture plate 14 is greater than the diameter of a wafer, to be processed, on substrate electrode 10. In addition, located above aperture plate 14 is a cylindrical shield 16, which is secured to the rim of aperture plate 14. The shield is made of aluminum and has a wall thickness of 10 mm and a height of 25 to 49 mm.

Figure 2:
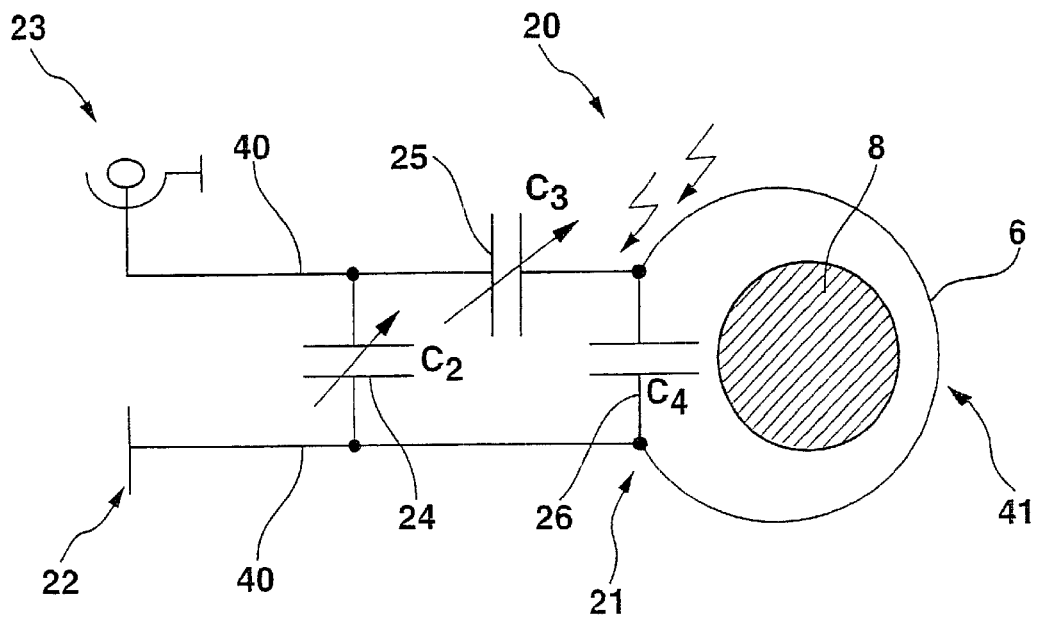
FIG. 2 an asymmetrical circuit arrangement for supplying the ICP coil, as known from the related art.

FIG. 2 schematically depicts an electrical circuit arrangement known from the related art for supplying ICP coil 6 with high-frequency a.c. voltage, and a section along line of intersection II of FIG. 1 through ICP coil 6, and highly dense plasma 8, while omitting reactor side wall 7. In this context, via a high-frequency injection 23, a high-frequency supply high voltage is fed via a generally known and commercially available coaxial cable, which has an impedance of 50 $\Omega$, to a "hot" coil end 20 of ICP coil 6, so that, there, a high-frequency high voltage V(t) of, for example, 3000 volts is applied to ground. A second, "cold" coil end 21 is connected to a ground connection 22. ICP coil 6 defines a coil plane 41. The supplying of the high-frequency voltage to and discharging of the high-frequency voltage away from "hot" coil end 20, and the grounding of "cold" coil end 21 are carried out by way of electrical conductors 40. To adjust impedance, two further adjustable capacitors $C_3$ 25 and $C_2$ 24 are provided. A further capacitor $C_4$ 26 produces the resonance condition of the resonant circuit formed together with ICP coil 6.

Figure 3:
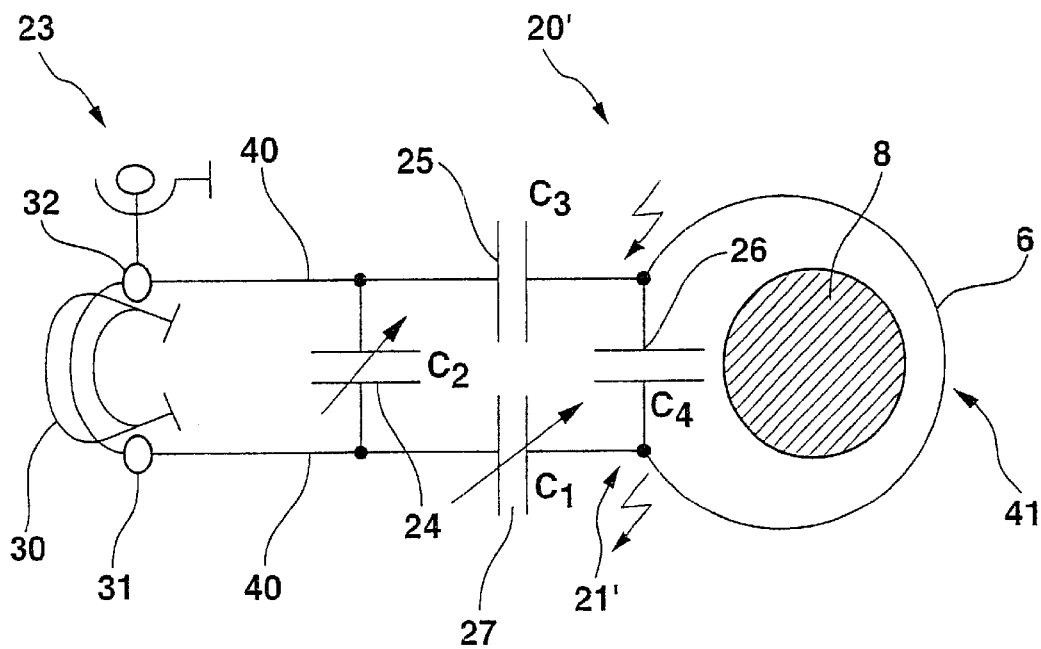
FIG. 3 a first symmetrical circuit arrangement.

As a first exemplary embodiment of the present invention, in a further refinement of the known implementation in accordance with FIG. 2, FIG. 3 illustrates the symmetrical supplying of ICP coil 6 via a first coil end 20' and a second coil end 21, which now both function as "hot" coil ends. A high-frequency high a.c. voltage is injected via high-frequency infeed 23 to a first feed point 32 and to a second feed point 31 connected thereto. The high a.c. voltage is fed to high-frequency infeed 23 via a standard coaxial cable having an impedance of 50 $\Omega$.

Thus, high-frequency infeed 23 initially supplies a high-frequency high a.c. voltage via electrical conductors 40 to first coil end 20'. In addition, a $\lambda/2$-delay line 30, which, depending on the high frequency selected, at 13.56 MHz has a length of 7.2 meters, and is preferably made of standard coaxial cable having an impedance of 50 $\Omega$, connects first feed point 32 and second feed point 31. In this case, minimal losses are produced in the cable, and no radiation is caused by standing waves on $\lambda/2$-delay line 30. The length of $\lambda/2$-delay line 30 is calculated as $\lambda/2*V$, V being a cable-dependent velocity factor, which amounts to 0.65 for most coaxial cables, and $\lambda$ being the wavelength of the high-frequency voltage when propagating in a vacuum. Thus, through $\lambda/2$-delay line 30, each feed point 31, 32 receives a high frequency high a.c. voltage of the same frequency and, in terms of absolute value, of virtually the same amplitude, 180° out of phase and, thus, in phase opposition. Overall therefore, $\lambda/2$-delay line 30 forms a mirror image of the high-frequency high voltage applied to first feed point 32, and supplies this to second feed point 31. At the same time, it balances the supplied high-frequency power. In terms of absolute value, the high-frequency, out-of-phase high voltages $\hat{U}(t)$ and $-\hat{U}(t)$ fed via high-frequency infeed 23 and feed points 31 and 32 to both ends 20' and 21' of ICP coil 6 have, for example, in each case an amplitude of 1500 volts to ground, which is still only half as great as the voltage V(t) applied previously in accordance with FIG. 2 at the "hot" end of the ICP coil.

All in all, one obtains a balanced-to-ground supply voltage at both cable cores, i.e., voltage characteristic +U(t) at the high-frequency supply cable in first feed point 32, and a voltage characteristic −U(t) at the output of the delay line in second feed point 31; relatively to each other, feed points 31, 32 having an impedance of 200 $\Omega$ (impedance quadrupled as compared to asymmetrical 50 $\Omega$ input). As a result, a voltage $\hat{U}(t)$ is fed to first coil end 20', and a voltage of $-\hat{U}(t)$ to the second coil end.

For purposes of matching the impedance between feed points 31, 32 and inductive plasma 8 produced by way of ICP coil 6 and resonant-circuit capacitor $C_4$ 26, three capacitors $C_2$ 24, $C_3$ 25 and C, 27 are additionally provided, whose capacitances in the case of $C_2$ 24 and $C_1$ 27 are able to be adjusted, and which form a so-called "matchbox". In this context, a precise, symmetrical injection of ICP coil 6 is advantageously achieved when the capacitance of capacitor $C_1$ 27 is equivalent to that of capacitor $C_3$ 25. However, small deviations from this symmetry can be tolerated without degrading the process. In particular, it is possible for one of the two capacitors, e.g., $C_1$ 27, in the same way as the so-called "load capacitor" $C_2$, to be designed as a variable capacitor, which is modified for purposes of matching impedance, while the other capacitor, e.g., $C_3$ 25, is retained at a fixed value, which, by approximation, reproduces the capacitance of the first in an adjusted position.

Table 1 illustrates examples of advantageous value combinations of capacitors $C_2$ 24, $C_3$ 25, $C_4$ 26 and $C_1$ 27, as well as the symmetry and asymmetry, respectively, attained therewith and given by the relationship of the capacitances of $C_1$ to $C_3$. To determine the required optimal capacitances, it is beneficial to perform iterative operations and to initially select, for example, a plausible, fixed value for the capacitance of capacitor $C_3$ 25. An impedance matching procedure is then carried out using capacitors $C_1$ 27 and $C_2$ 24 within the "matchbox", thereby optimally adapting the 200 $\Omega$ input impedance between feed points 32 and 31 to the produced inductive plasma 8.

From the fixed value of the capacitance of $C_3$ 25 and the adjusted value of the capacitance of $C_1$ 27, one obtains a total capacitance $C'=(C_1^{-1}+C_3^{-1})^{-1}$ from the series connection of both capacitors that is decisive for the impedance matching. If, at this point, one selects a new, fixed capacitance of $C_3'$ for fixed-value capacitor $C_3$ 25 in accordance with $C_3'=(2*C')=2*(C_1^{-1}+C_3^{-1})^{-1}$, then, based on this new value for the capacitance of capacitor $C_3$ 25, the "matchbox" will adjust variable capacitor $C_1$ 27 to exactly the same value, i.e., $C_1=C_3=C'$. This leads to the same total capacitance of the series connection and, thus, to the same impedance transformation as before. Now, however, both capacitors $C_1$ and $C_3$ and, thus, the two coil voltages at both coil ends 21' and 20' are symmetrical (balanced). Therefore, one single iteration (operation) enables one to find the optimal fixed capacitance value of capacitor $C_3$ 25 for a symmetrical, adapted operation of the inductive source arrangement. Capacitors $C_2$ 24 and $C_4$ 26 are not relevant to these considerations, since they do not influence the symmetry.

TABLE 1

| | | |
|---|---|---|
| $C_1 =$ | 323 pF | 390 pF |
| $C_2 =$ | 245 pF | 245 pF |
| $C_3 =$ | 450 pF | 375 pF |
| $C_4 =$ | 150 pF | 150 pF |
| Asymmetry: | 1.20:1 | 0.98:1 |

Figure 4:
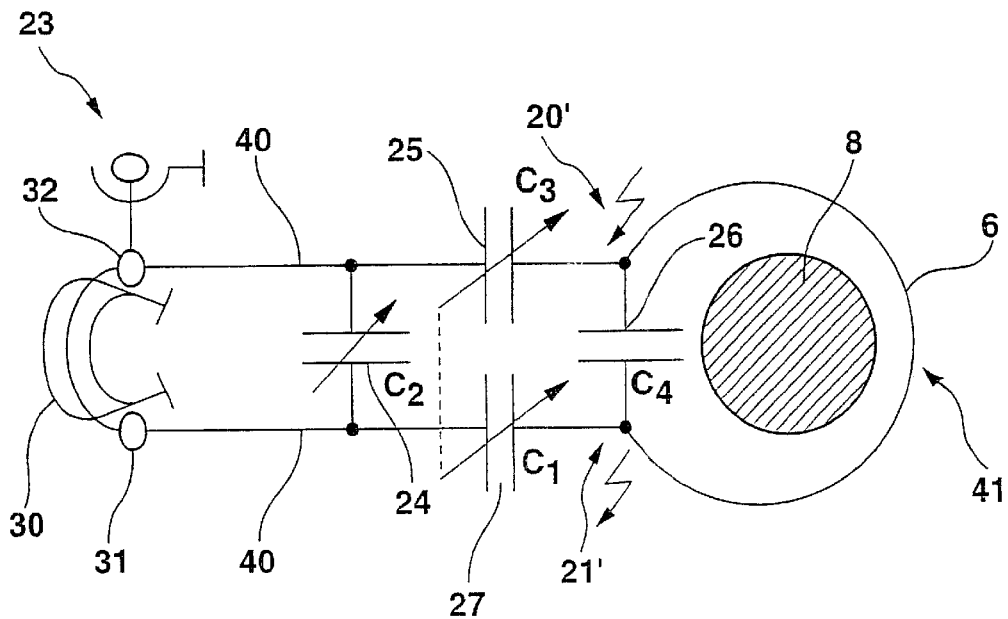
FIG. 4 a second symmetrical circuit arrangement.

As a further exemplary embodiment based on a design that is otherwise the same as that shown in FIGS. 1 and 3, FIG. 4 depicts the use of a tandem variable capacitor for the two capacitors $C_1$ 27 and $C_3$ 25, where both capacitance values are simultaneously varied. This tandem arrangement is implemented, for example, by placing both variable capacitors $C_1$ 27 and $C_3$ 25 in series using an electrically insulating mechanical coupling, thereby simultaneously varying them, or by placing them side-by-side and simultaneously moving them using a chain or rope drive.

In another specific embodiment employing side-by-side variable capacitors, electrically insulating gear wheels can also be used to mechanically couple the two variable capacitor shafts to one another. It is also possible to use two autonomous variable capacitors $C_1$ 27 and $C_3$ 25 that are synchronously controlled by servomotors. If necessary, small, additional trimming capacitors can also be used, which, as fixed-value capacitors, are connected in parallel to variable capacitors $C_1$ 27 and $C_3$ 25, to achieve a completely balanced symmetry. In any case, ICP coil 6 is always symmetrically fed (energized), so that optimal conditions of symmetry always prevail in ICP coil 6 and in the produced highly dense plasma 8, making it possible to optimally cover a great number of diverse configuration processes using one and the same system configuration.

Figure 5:
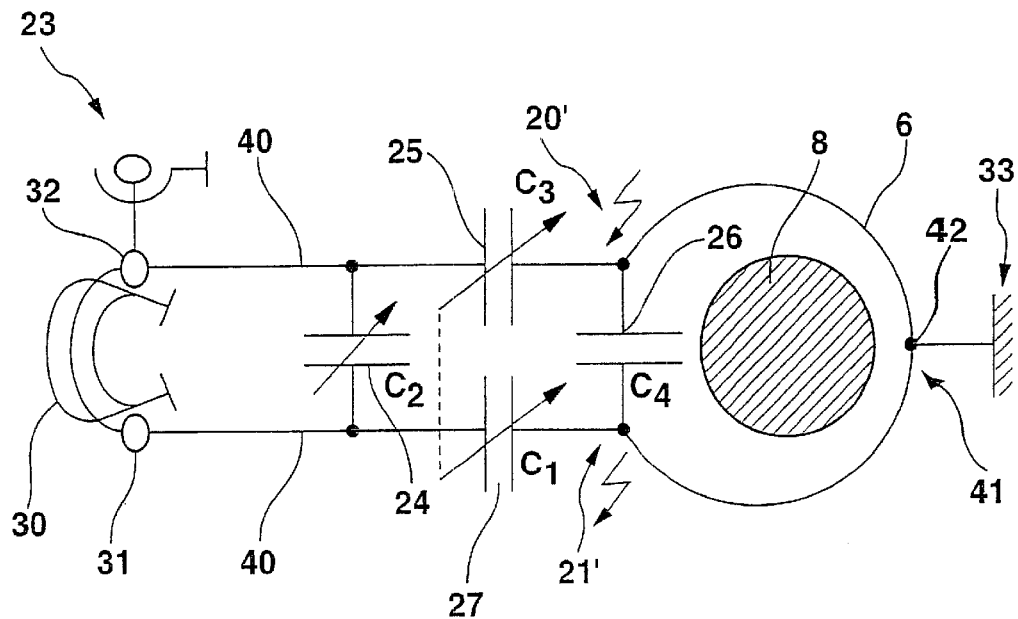
FIG. 5 a third symmetrical circuit arrangement for feeding the ICP coil.

Additionally indicated in Table 2 is a set of optimal capacitances, which are suited for the exemplary embodiment in accordance with FIG. 4, as well as for the subsequent exemplary embodiment in accordance with FIG. 5.

TABLE 2

| | |
|---|---|
| $C_1 =$ | 382 pF |
| $C_2 =$ | 245 pF |
| $C_3 =$ | $C_1$ |
| $C_4 =$ | 150 pF |
| Asymmetry: | 1:1 |

The precision symmetrical supplying of the coil, as described in the exemplary embodiment based on FIG. 4, has the significant advantage that coil center 42 is now connected at all times to a voltage of 0 volts. For that reason, coil center 42 can now be explicitly grounded using a coil grounding connection 33, as explained on the basis of FIG. 5, as an additional exemplary embodiment in continuation of FIG. 4. Explicitly grounding coil center 42 solves the problem of so-called high-frequency, common-mode voltages occurring on ICP coil 6 when it is not fixedly connected to the ground potential. These high-frequency common-mode voltages, which are superimposed on the high-frequency differential-mode voltages driving the current flow in ICP coil 6, are the same at every point on ICP coil 6 and, themselves, do not produce any current flow within the coil circuit.

These common-mode voltages can be caused by small phase errors between the applied high-frequency high-voltages at both coil ends 20', 21', by effects (disturbances) from the highly dense plasma 8 on ICP coil 6, as well as by other slight errors of symmetry. The common-mode voltage is attenuated only by a capacitive coupling into the highly dense plasma 8 and via induced displacement currents through the dielectric side wall 7 of reactor 8. ICP coil 6 functions partially as an electrode, which drives a capacitively coupled secondary plasma—similar to a known triode system having a dielectric between the anode and the plasma. The mentioned induced displacement currents in plasma 8 are relatively small as compared to the coil currents driving the inductive, highly dense plasma 8. Accordingly, the amounts of energy additionally coupled (injected), as a result, into plasma 8 are initially small. Nevertheless, these common-mode voltages can significantly degrade the plasma properties, especially at very high high-frequency powers of more than 600 watts at ICP coil 6. Configuring coil grounding 33 in coil center 42 effectively suppresses the mentioned common-mode voltages at ICP coil 6, clearly improving, for example, profile fidelity and etch rate homogeneity in plasma etching processes, particularly when working with very high high-frequency power.

What is claimed:

1. A plasma processing system for etching a substrate using a highly dense plasma in a reactor, comprising:
an ICP (inductively coupled plasma) coil having a first coil end and a second coil end, which each communicate via a corresponding first feed point and a corresponding second feed point with a high-frequency infeed and to which is applied in, each case via the feed points a high-frequency a.c. voltage of the same frequency from a common source, and wherein the first feed point and the second feed point are linked to one another by a $\lambda/2$-delay line, so that the high-frequency a.c. voltages applied to both coil ends are at least substantially in phase opposition to one another.

2. The plasma processing system of claim 1, wherein the two a.c. voltages applied to the two coil ends have at least nearly same amplitude.

3. The plasma processing system of claim 1, wherein the ICP coil has only one winding.

4. The plasma processing system of claim 1, wherein the ICP coil at least substantially surrounds the reactor on a region by region basis.

5. The plasma processing system of claim 1, wherein an aperture is provided in the reactor between a plasma source, as the location for producing the highly dense plasma, and the substrate.

6. The plasma processing system of claim 1, wherein the substrate is arranged on a substrate electrode, which is connected to a high-frequency voltage source.

7. The plasma processing system of claim 1, wherein electrical conductors, which are run in parallel to a coil plane formed by the ICP coil, are used to apply the high-frequency a.c. voltages to the first coil end and to the second coil end.

8. The plasma processing system of claim 1, wherein currents occurring in an ambient environment of the ICP coil and/or of the reactor are conducted in such a way that they run in parallel to a coil plane formed by the ICP coil.

9. The plasma processing system of claim 1, wherein an electrical circuit arrangement is provided for impedance matching between the two feed points and the two coil ends connected thereto.

10. The plasma processing system of claim 9, wherein the electrical circuit arrangement is a capacitive network having capacitors.

11. The plasma processing system of claim 10, wherein the capacitive network is at least substantially symmetrical.

12. The plasma processing system of claim 10, wherein the capacitive network is at least substantially adjustable.

13. The plasma processing system of claim 1, wherein the coil center of the ICP coil is grounded.

14. The plasma processing system of claim 1, wherein the ICP coil surrounds the reactor, in such a way that the coil ends exhibit a maximal distance to the reactor.

15. The plasma processing system of claim 1, wherein the ICP coil surrounds the reactor, which is a circular ceramic vessel, in such a way that the coil ends exhibit a maximal distance to the reactor.

16. The plasma processing system of claim 4, wherein the ICP coil surrounds the reactor, in such a way that the coil ends exhibit a maximal distance to the reactor.

17. The plasma processing system of claim 4, wherein the ICP coil surrounds the reactor, which is a circular ceramic vessel, in such a way that the coil ends exhibit a maximal distance to the reactor.

18. The plasma processing system of claim 1, wherein the substrate and/or the ICP coil are arranged so as to provide maximum distance between the substrate and the ICP coil perpendicularly to the coil plane.

19. The plasma processing system of claim 1, wherein a circular, metallic spacer is inserted in the reactor side wall between the highly dense plasma, produced in the reactor as a plasma source, and the substrate.

* * * * *

UNITED STATES PATENT AND TRADEMARK OFFICE
CERTIFICATE OF CORRECTION

PATENT NO. : 6,531,031 B1
DATED : March 11, 2003
INVENTOR(S) : Volker Becker et al.

It is certified that error appears in the above-identified patent and that said Letters Patent is hereby corrected as shown below:

<u>Title page</u>,
Item [57], ABSTRACT,
Line 12, change "λ2" to -- λ/2 --.

<u>Column 2</u>,
Line 48, delete "i.e.,".
Line 49, change "end, the" to -- end, i.e., the --.

<u>Column 6</u>,
Line 54, change "connection (feed pipe 3)" to -- connection (feed pipe) 3 --.

<u>Column 8</u>,
Line 21, "+U(t)" to -- +Û(t) --.
Line 23, "-U(t)" to -- -Û(t) --.
Line 32, change "C,27" to -- $C_1 27$ --.
Line 64, change "$C_3^1$" to -- $C_3^{-1}$ --.

Signed and Sealed this

Twentieth Day of April, 2004

JON W. DUDAS
*Acting Director of the United States Patent and Trademark Office*